United States Patent
Shieh et al.

(10) Patent No.: US 9,064,090 B2
(45) Date of Patent: Jun. 23, 2015

(54) PROCESS FOR REDUCING LUBRICATION OIL CONSUMPTION FOR INTERNAL COMBUSTION ENGINES

(75) Inventors: Tenghua Tom Shieh, Ann Arbor, MI (US); Shohei Nomura, Ann Arbor, MI (US); Erich Benjamin Fiederlein, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 666 days.

(21) Appl. No.: 13/397,735

(22) Filed: Feb. 16, 2012

(65) Prior Publication Data

US 2013/0218535 A1   Aug. 22, 2013

(51) Int. Cl.
*G06G 7/48* (2006.01)
*G06F 17/50* (2006.01)

(52) U.S. Cl.
CPC ............. *G06F 17/5095* (2013.01); *Y02T 10/82* (2013.01)

(58) Field of Classification Search
None
See application file for complete search history.

(56) References Cited

U.S. PATENT DOCUMENTS

| | | |
|---|---|---|
| 5,705,742 A | 1/1998 | Fox et al. |
| 6,064,996 A | 5/2000 | Yamaguchi et al. |
| 6,079,258 A | 6/2000 | List et al. |
| 2006/0137428 A1 | 6/2006 | Agama et al. |
| 2008/0312880 A1 | 12/2008 | McLuckie |

OTHER PUBLICATIONS

Kurbet et al. Review on Effects of Piston and Piston Ring Dynamics Emphasis Consumption and Frictional Losses in Internal Combustion Engines ICE2007 International Conference on Engines Automobile, Sep. 2007.*
Wannatong et al. Simulation Algorithm for Piston Ring Dynamics Simulation Modeling Practice and Theory 16, 2008, pp. 127-146.*
Tian Dynamic Behaviors of Piston Rings and Their Practical Impact. Part 2: Oil Transport, Friction and Wear of Ring/Liner Interface and the Effects of Piston and Ring Dynamics IMechE 2002, pp. 229-247.*
Chittenden et al. Analysis of the Piston Assembly, Bore Distortion and Future Developments Elsevier Science Publisher B.V., 1993.*

* cited by examiner

*Primary Examiner* — Omar Fernandez Rivas
*Assistant Examiner* — Cuong Luu
(74) *Attorney, Agent, or Firm* — Gifford, Krass, Sprinkle, Anderson & Citkowski, P.C.

(57) ABSTRACT

A process for selecting a piston ring for a piston containing internal combustion engine such that the engine experiences a reduction in lubrication oil consumption (LOC) used therein. The process can include providing engine specifications for an engine for which the piston ring is to be selected and simulating engine temperatures for the engine as a function of the engine specifications. The process can also include simulating bore distortion for the engine as a function of the simulated engine temperatures and simulating piston ring dynamics for the engine as a function of the simulated bore distortion. Once the simulated piston ring dynamics have been obtained, the process can include calculating a plurality of LOC values and selecting a piston ring as a function of the calculated LOC values.

9 Claims, 5 Drawing Sheets

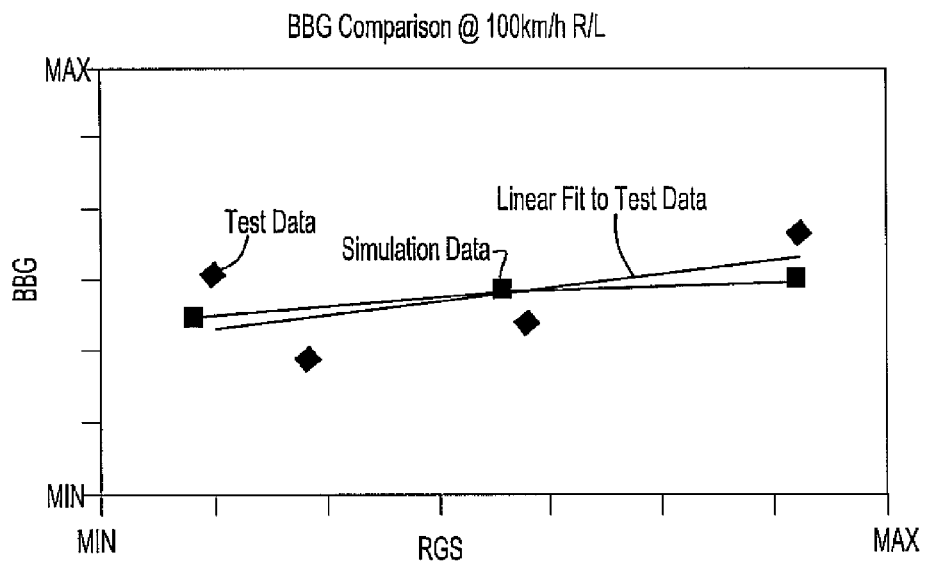
*Fig-4*
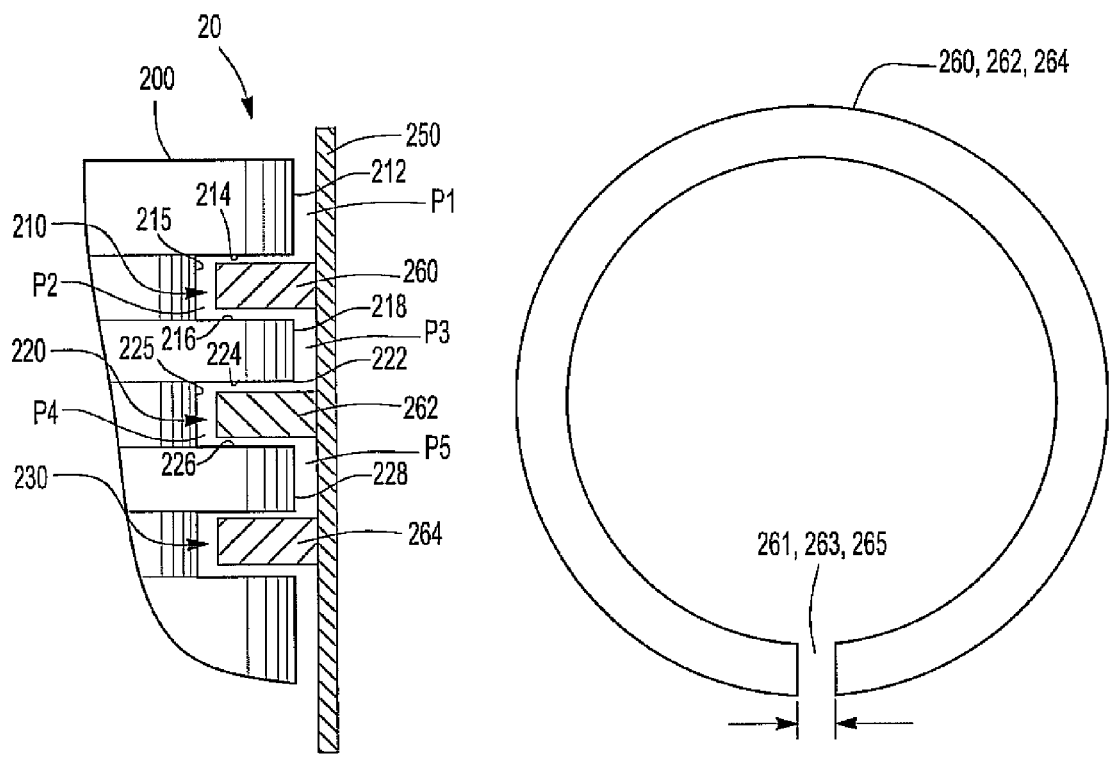
*Fig-5*
*Fig-6*

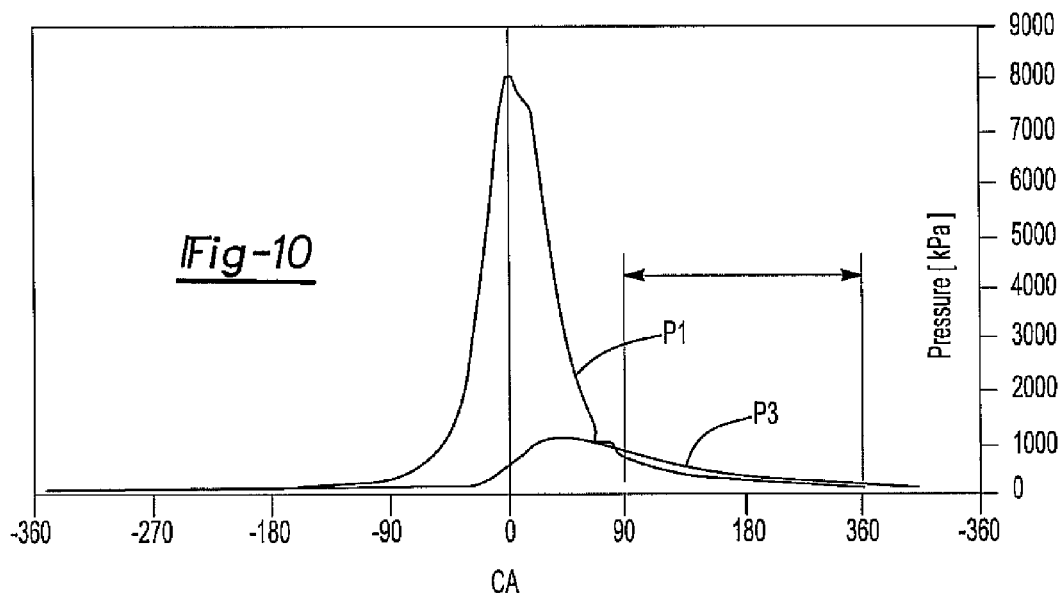
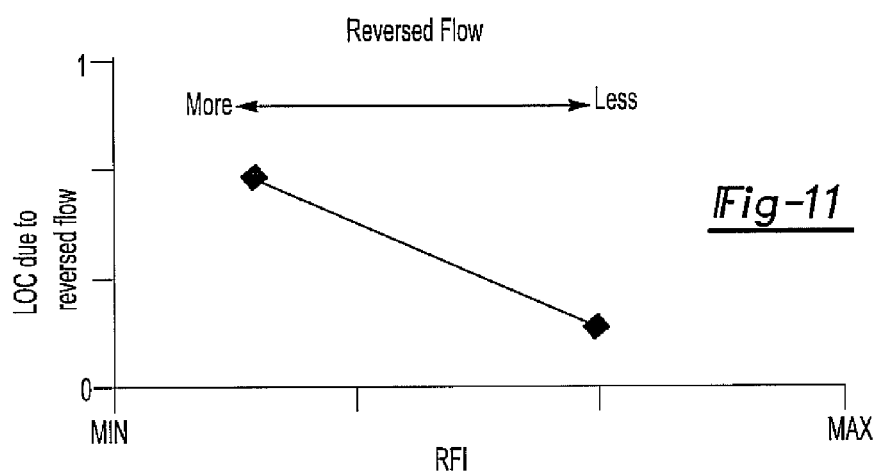
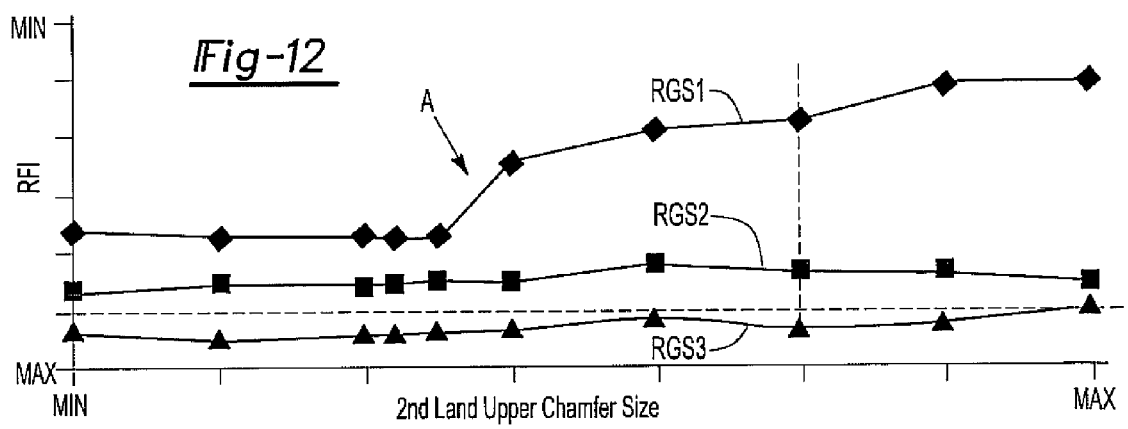

PROCESS FOR REDUCING LUBRICATION OIL CONSUMPTION FOR INTERNAL COMBUSTION ENGINES

FIELD OF THE INVENTION

The present disclosure is related to a process for reducing lubrication oil consumption in a piston containing internal combustion engine.

BACKGROUND OF THE INVENTION

Many internal combustion engines, for example automotive engines, motorcycle engines, off-road vehicle engines, and the like, use oil to lubricate and cool various engine components such as pistons, crankcases, cylinders, and the like. The oil is typically used in combination with one or more pistons that have one or more piston rings, the one or more piston rings employed in part to combustion gas above the piston and the oil below the piston. However, it is appreciated that during operation of internal combustion engines as listed above, oil can pass by the piston rings up above the piston and into the combustion chamber. Once at this location, the oil typically burns and is removed through the exhaust system of the engine. However, it is also appreciated that at least part of the oil can form deposits within the combustion chamber and reduce the efficiency of the engine. Therefore, a process that provides for a reduction in the loss of oil for an internal combustion engine would be desirable.

SUMMARY OF THE INVENTION

The present invention provides a process for selecting a piston ring for a piston containing internal combustion engine such that the engine experiences a reduction in loss of lubrication oil used therein. The process can include providing engine specifications for an engine for which the piston ring is to be selected and simulating engine temperatures for the engine as a function of the engine specifications. The process can also include simulating bore distortion for the engine as a function of the simulated engine temperatures and simulating piston ring dynamics for the engine as a function of the simulated bore distortion. Once the simulated piston ring dynamics have been obtained, the process can include calculating a plurality of lubrication oil consumption (LOC) values and selecting a piston ring as a function of the calculated LOC values.

In some instances, the engine specifications can include an engine load, revolutions per minute for an engine load, a coolant flow rate for an engine load, piston properties for the engine, cylinder liner properties for the engine, and/or engine head properties for the engine. In addition, the engine temperatures can include an engine block temperature, an engine head temperature, a cylinder liner temperature, and a valve seat temperature.

In addition to the simulated bore distortion, the process can include simulating engine distortion, the engine distortion being a function of engine bolt load, engine gasket properties, engine assembly load, and/or engine assembly plus thermal load. Furthermore, the simulated ring dynamics can be a function of engine piston specifications, piston ring specifications, engine cylinder pressure, and engine crankcase pressure.

The simulated ring dynamics can include simulation of fluttering of a top piston ring which may or may not be a function of a ring gap for a second piston ring and/or an upper chamfer radius of a second piston groove for the second piston ring.

The process can further include calculating a reverse flutter index (RFI) for the top piston ring, the RFI calculated from the expression:

$$RFI = \frac{\sum_{CA=90}^{CA=270} \frac{mdot13}{P3}}{\sum_{CA=90}^{CA=270} \theta_{CA}}$$

where mdot13 is a mass flow rate through a ring gap for the top piston ring, P3 is a pressure between a liner and a piston land between the top piston ring and the second piston ring, and $\theta_{CA}$ is a crank angle for the piston. In addition, the RFI can be plotted for one or more piston ring gaps for the second piston ring as a function of the upper land chamfer radius of the second piston groove, the plot of the RFI affording for determination of one or more piston ring gaps that provide a reduced RFI.

In some instances, the RFI can be correlated with actual LOC for the engine that has been determined through testing, such a correlation affording for confirmation of which one or more piston ring gaps provide a reduced loss of oil.

BRIEF DESCRIPTION OF THE DRAWINGS

FIG. 4 is an illustrative graphical plot of blowby gas (BBG) rate test data compared to BBG rate simulation data as a function of ring gap size (RGS);

FIG. 5 is a schematic illustration of a piston with piston rings located within a cylinder liner;

FIG. 6 is a top view of a piston ring;

FIG. 10 is an illustrative graphical plot of pressure between a top land and a cylinder liner (p1) and a second land and the cylinder liner (p3) as a function of crank angle;

FIG. 11 is an illustrative graphical plot of lubrication oil consumption (LOC) due to reversed flow as a function of reverse flutter index (RFI) and based on actual test data;

FIG. 12 is an illustrative graphical plot of RFI as a function of $2^{nd}$ land upper chamfer size for three different gap sizes (1, 2, 3) of a second piston ring;

DETAILED DESCRIPTION OF THE PRESENT INVENTION

Figure 1:
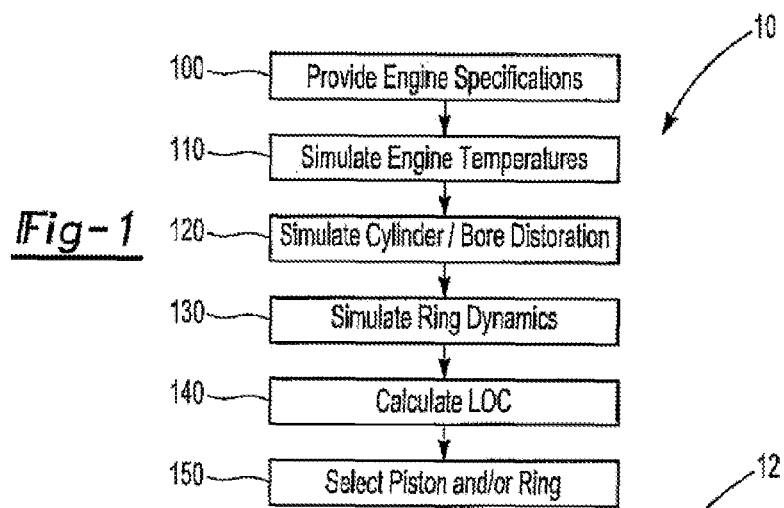
FIG. 1 is a schematic diagram illustrating a process according to an embodiment of the present invention.

A process for selecting a piston ring for a piston containing internal combustion engine that affords for reduced lubrication oil consumption (LOC) for the engine is provided. The reduced LOC affords for improved engine efficiency and, as such, the process has utility as a process for improving fuel economy.

The process can include simulation of LOC for an engine as a function of one or more engine specifications and/or properties. In addition, the process can provide which engine specifications and/or properties are critical for reducing LOC. In some instances, the process provides an optimized ring gap size for one or more piston rings within the internal combustion engine.

The process can include simulation of bore distortion and piston ring dynamics that allow for the calculation of a plurality of LOC values which then affords for selection of a piston ring as a function of the calculated LOC values. The bore distortion can be a function of simulated engine temperatures with the engine temperatures being a function of engine specifications. For example, the engine temperatures can be calculated based on an engine load, revolutions per minute (RPM) for an engine load, a coolant flow rate for an engine load, piston properties for the engine, cylinder liner properties for the engine, and engine head properties. In addition, the simulated engine temperatures can provide one or more engine block temperatures, one or more engine head temperatures, one or more cylinder liner temperatures, and/or one or more valve seat temperatures for the engine.

In some instances, the process can further include simulating engine distortion in addition to the simulated bore distortion, the simulated bore distortion being a function of the simulated engine distortion. The simulated engine distortion can be a function of bolt load for the engine, gasket properties, assembly load, and/or engine assembly plus thermal load.

Regarding piston ring dynamics, piston specifications, ring specifications, cylinder pressure, and/or crankcase pressure for the engine can be taken into account in order to obtain suitable and/or accurate simulations of one or more piston rings during operation of the engine. In some instances, the simulated ring dynamics can include fluttering of a top piston ring, the fluttering being a function of a ring gap for a second piston ring and/or an upper chamfer radius or size of a second piston ring groove for the second piston ring. For the purposes of the present invention, the term "fluttering" is defined as movement in an up-and-down direction of the piston ring within the ring's respective piston groove and can include up-and-down movement with a frequency that is greater than the cyclic movement of the piston to which the ring is attached.

The process can also include calculation of a reverse flutter index (RFI) for the top piston ring and comparing the calculated RFI for one or more second piston ring gaps as a function of the upper land chamfer size of the second piston ring groove for the purpose of determining one or more piston ring gaps that provide a reduced RFI. In addition, the RFI can be correlated with actual LOC values from engine testing, the correlation allowing for confirmation of which one or more piston ring gaps provide a reduced LOC.

Turning now to FIG. 1, a process for improving fuel efficiency of a piston containing internal combustion engine by selecting an optimized piston and/or piston ring for the engine is shown generally at reference numeral 10. The process 10 can include providing engine specifications at step 100 and simulating engine temperatures at step 110. In addition, a cylinder and/or bore distortion can be simulated at step 120 as can ring dynamics at step 130. Based on the simulated ring dynamics, a LOC can be calculated at step 140 with selection of a piston and/or piston ring as a function of low LOC performed at step 150.

Figure 2:
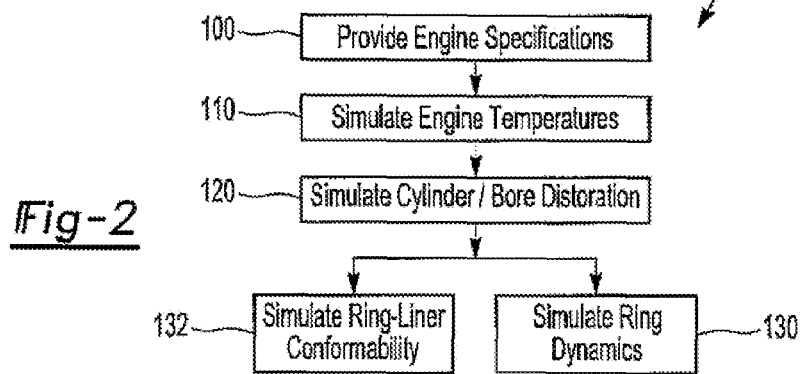
FIG. 2 is a schematic diagram illustrating a process according to an embodiment of the present invention.

Referring now to FIG. 2, a process 12 is provided in which in addition to simulation of ring dynamics at step 130, simulation of ring-liner conformability is provided at step 132, followed by calculation of LOC at step 140 and selection of a piston and/or piston ring as a function of low LOC at step 150.

Figure 3:
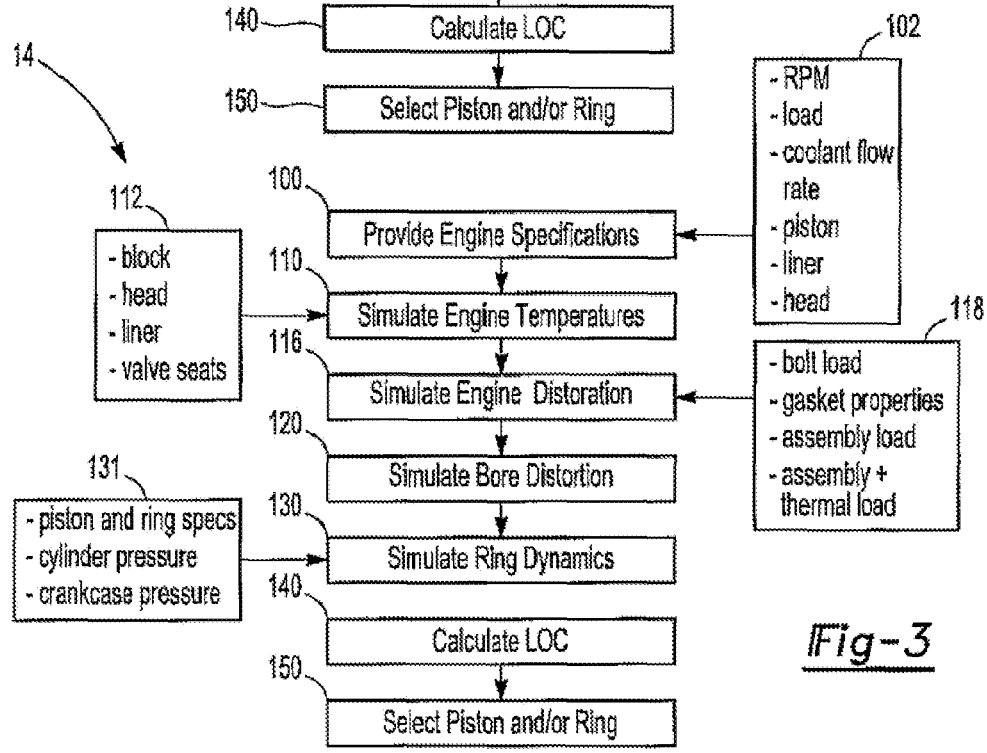
FIG. 3 is a schematic diagram illustrating a process according to an embodiment of the present invention.

The engine specifications provided at step 100 can include engine load, RPM for an engine load, coolant flow rate for an engine load, piston properties for the engine, liner properties, and/or head properties as illustrated at reference numeral 102 for process 14 illustrated in FIG. 3. In addition, the simulated engine temperatures at step 110 can provide an engine block temperature, an engine head temperature, a cylinder liner temperature, a valve seat temperature, and the like as illustrated at reference numeral 112. Overall engine distortion can be provided at step 116 and may or may not be a function of at least one of the elements shown at reference numeral 118, i.e. engine bolt load, gasket properties, assembly load, assembly plus thermal load, and the like. Similar to FIGS. 1 and 2, bore distortion can be simulated at step 120 and ring dynamics can be simulated at step 130, the ring dynamics being a function of piston properties, ring properties, cylinder pressure, crankcase pressure, etc., as shown at 131. Also, LOC values can be calculated at step 140 and a piston and/or piston ring can be selected at step 150.

In order to better illustrate the invention and yet not limit the scope in any way, an example of the process is described below.

EXAMPLE

Testing and simulation for a four cylinder internal combustion engine for a motor vehicle were performed, the engine operated at a load corresponding to a steady and consistent speed. Engine specifications that included RPM, engine load, coolant flow rate, piston properties, cylinder liner properties, and engine head properties were used to simulate engine temperatures with a typical commercially available simulation program known to those skilled in the art used to simulate the engine temperatures.

Based on the engine temperatures, piston temperatures and groove flank tilt angles were also simulated, as were the temperatures of the engine block, engine head, cylinder liner, and valve seats. Based on the engine temperatures, and in combination with bolt load and gasket properties, engine distortion was simulated, along with bore distortion for the cylinders.

Based on the bore distortion for the cylinders, simulation blowby gas (BBG) calculations as a function of ring gap size (RGS) were performed and compared with actual test data (FIG. 4). It is appreciated that BBG is known to those skilled in the art as the amount of combustion gas that passes by the piston rings during operation of the engine. As shown in FIG. 4, the actual test data was reasonably simulated by the process and thereby provided support for a successful simulation of the engine.

The BBG calculations used simulation of a piston with piston rings and a cylinder liner as illustratively shown in FIG. 5 at reference numeral 20. The piston/cylinder assembly 20 included a piston 200 with a top piston ring 260, a second piston ring 262, and a third piston ring 264 that fit at least partially within a top piston groove 210, a second piston groove 220 and a third piston groove 230, respectively. The piston 200 and the piston rings 260, 262, 264 were adjacent to a cylinder liner 250 and the piston rings had a piston gap 261, 263, 265 as shown in FIG. 6.

The top piston groove 210 has an upper land 212, an upper groove flank 214, a lower groove flank 216 and a lower land 218. It is appreciated that the lower land 218 of the top piston groove 210 is also the upper land for the second piston groove 220 and the groove 220 has an upper groove flank 224, a lower groove flank 226 and lower land 228. Again, it is appreciated that the lower land 228 of the second piston groove 220 is the upper land for the third piston groove 230. In addition, each of the piston grooves have an upper and lower chamfer that adjoins the respective groove flank and land. For example, the second piston groove 220 has a $2^{nd}$ land chamfer 222 that has a size and/or radius which may or may not be limited by manufacturing techniques. In some instances, a chamfer size may desirably be kept as small as reasonably possible.

In addition to the above, BBG rate calculations assumed various pressure (P1-P5) between: the upper land 212 and liner 250 (P1); the top piston ring 260 and a top ring groove base 215 (P2); the lower land 218 and liner 250 (P3); the second piston ring 262 and a second ring groove base 225 (P4); and the lower land 228 and liner 250 (P5).

Figure 7:
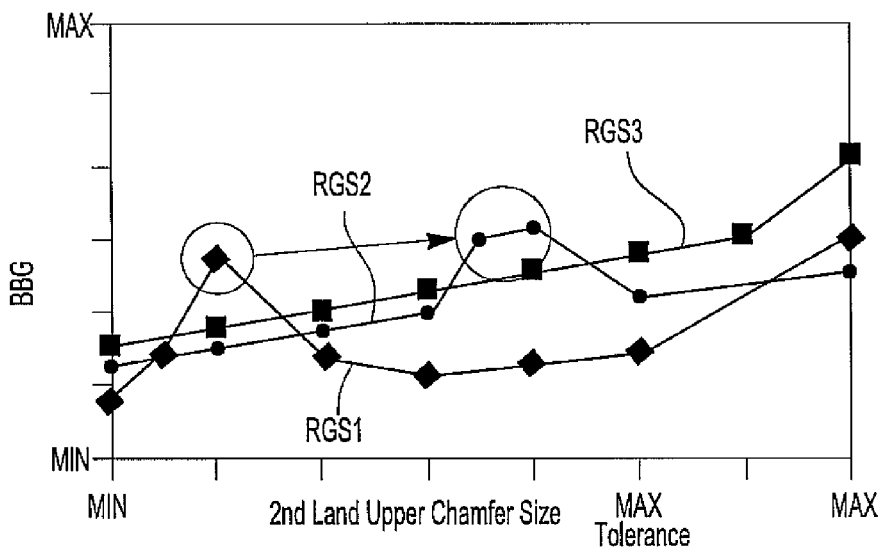
FIG. 7 is an illustrative graphical plot of blowby gas rate as a function of $2^{nd}$ land upper chamfer size for three different ring gap sizes (RGS1, RGS2, RGS3)

Turning now to FIG. 7, the BBG was plotted as a function of second ($2^{nd}$) land upper chamfer size for three different second ring gap sizes (RGS)—RGS1, RGS2 and RGS3 where RGS1 was less than RGS2 which was less than RGS3, i.e. RGS1<RGS2<RGS3. As shown in the figure, the second piston ring gap size of RGS1 afforded a peak in BBG for a first $2^{nd}$ land upper chamfer size which was delayed to a second and larger $2^{nd}$ land chamfer size for the second ring gap size RGS2. Finally, simulation of the second ring gap size RGS3 resulted in the removal or correction of any peak BBG. As such, the results illustrated that an increase in second ring gap size can reduce or eliminate peaks or spikes of BBG and corresponding mass flow rate through a top piston ring gap.

Figure 8:
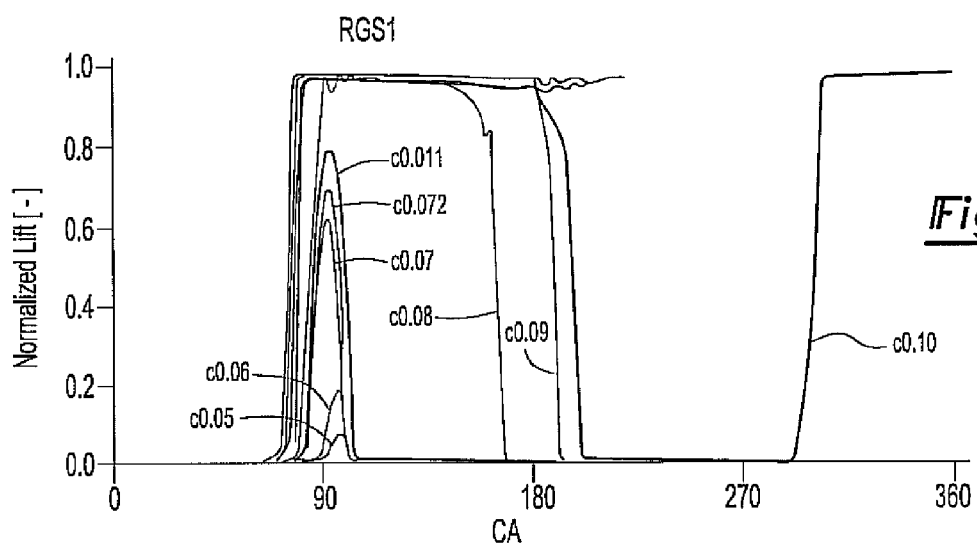
FIG. 8 is an illustrative graphical plot of normalized lift for a piston ring as a function of crank angle (CA) and a first piston ring gap size (Ring Gap Size #1)
Figure 9:
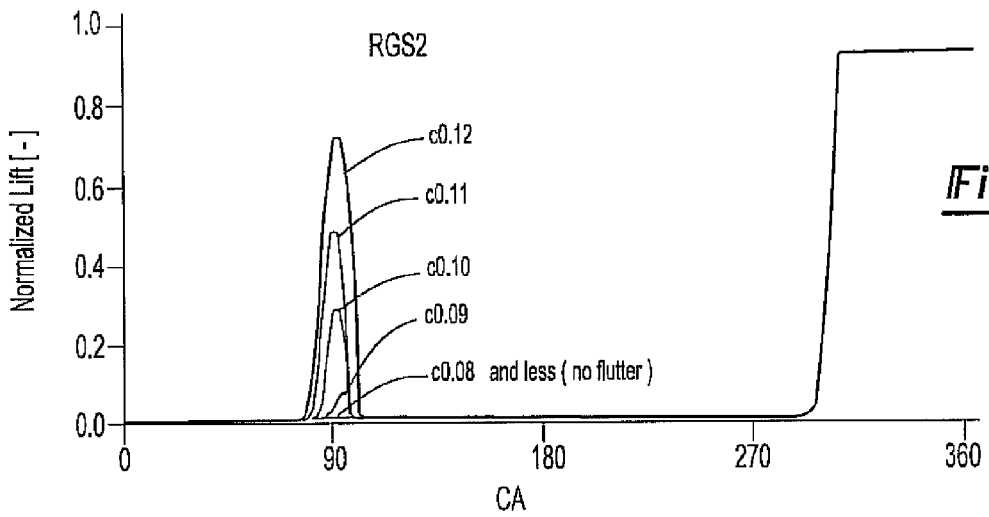
FIG. 9 is an illustrative graphical plot of normalized lift for a piston ring as a function of CA and a second piston ring gap size (Ring Gap Size #2)

In an effort to determine if the spikes in blowby gas were associated with fluttering of the top piston ring, normalized lift of the top piston ring as a function of crank angle (CA) was simulated for a plurality of $2^{nd}$ land chamfer sizes (c0.05-c0.12) as illustrated in FIGS. 8 and 9. As shown in these two figures, increasing the piston ring gap from RGS1 to RGS2 reduced the amount of normalized lift.

Once fluttering had been determined to be the cause of the spikes and blowby gas, a reverse flutter index (RFI) was derived and determined to be defined by the expression:

$$RFI = \frac{\sum_{CA=90}^{CA=270} \frac{mdot13}{P3}}{\sum_{CA=90}^{CA=270} \theta_{CA}}$$

where mdot13 is a mass flow rate through a ring gap for the top piston ring, P3 is a pressure between a liner and a piston land between the top piston ring and the second piston ring (see FIGS. 5 and 10), and $\theta_{CA}$ is a crank angle (CA) for the piston. It is appreciated that CA is also a measure of and/or can be equivalent to engine timing for the internal combustion engine.

In addition to determining the RFI for the engine, the RFI was correlated with empirical data for LOC due to reverse flow from the crankcase up through the piston rings and into the combustion chamber. FIG. 11 shows such a correlation in which an increase in LOC results in a decrease of RFI.

In an effort to determine the land chamfer effect on LOC, the RFI was plotted as a function of $2^{nd}$ land upper chamfer size for the three ring gap sizes RGS1, RGS2 and RGS3 as illustrated in FIG. 12. As shown in this plot, the lowest ring gap size RGS1 resulted in a significant increase in RFI at location A along the x-axis, along with a monotonic increase in the RFI for increasing $2^{nd}$ land upper chamfer sizes. In contrast, the piston ring gap sizes RGS2 and RGS3 mm resulted in a generally steady or level behavior of RFI when plotted as a function of the $2^{nd}$ land upper chamfer sizes.

Figure 13:
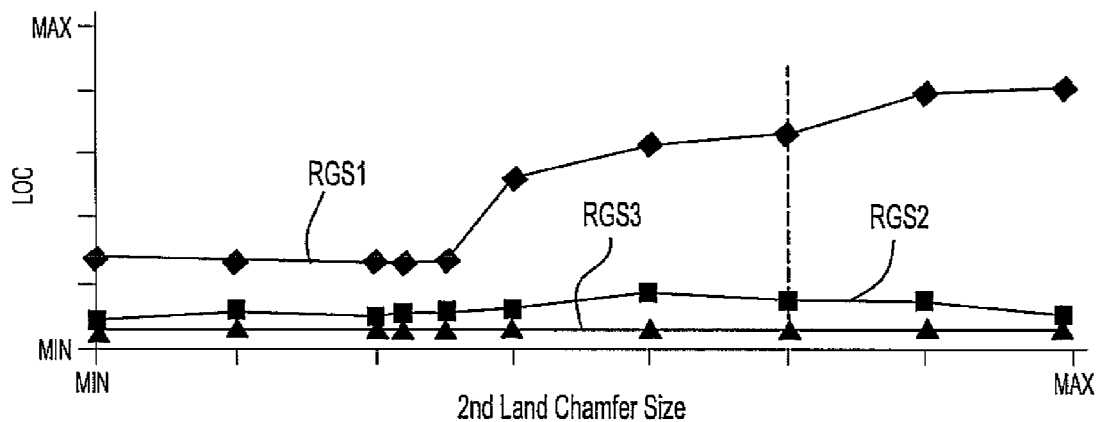
FIG. 13 is an illustrative graphical plot of lubrication oil consumption (LOC) as a function of $2^{nd}$ land upper chamber size for three different gap sizes (1, 2, 3) of a second piston ring.

With the correlation between RFI and LOC, LOC versus $2^{nd}$ land chamfer size was calculated for the three ring gap sizes RGS1, RGS2, RGS3. The results are shown in FIG. 13 with the LOC exhibiting similar behavior as the RFI in FIG. 12.

Figure 14:
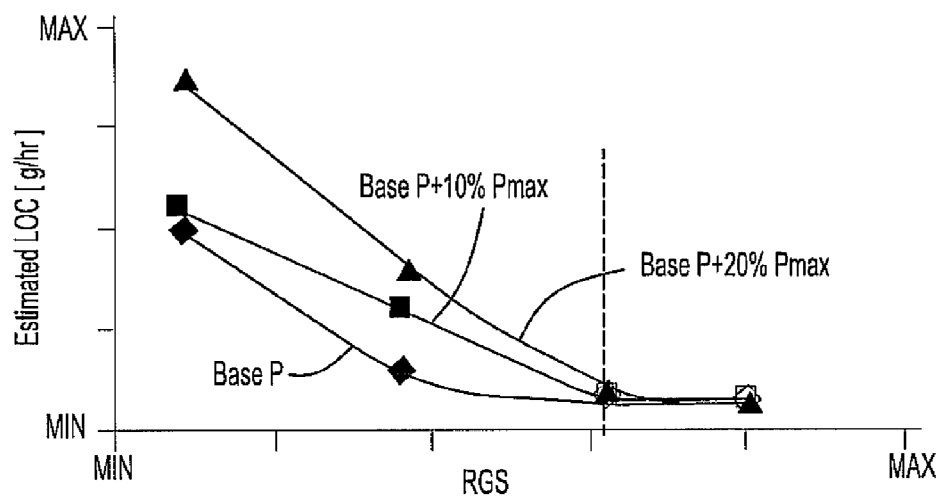
FIG. 14 is an illustrative graphical plot of estimated LOC as a function of RGS for a second piston ring and three different combustion chamber pressures.

In an effort to determine the effect of combustion chamber pressure, a plot of estimated LOC as a function of piston ring gap size for three different pressures was calculated and is shown in FIG. 14. The first pressure was a base pressure (Base P), the second pressure was the base pressure plus 10% of a maximum pressure (Base+10% Pmax), and the third pressure was the base pressure plus 20% the maximum pressure (Base P+20% Pmax). As shown in the graph, an increase in pressure resulted in an increase in LOC; however with increasing piston ring gap sizes, the effect was essentially negligible.

Based on the examples and embodiments discussed above, it is appreciated that modifications, changes, additions, subtractions, and the like can be included with the process and yet fall within the scope of the invention. Stated differently, one skilled in the art will recognize that the process can include any number of modifications and yet still be used to simulate, model, etc. LOC for an internal combustion engine. As such, the scope of the invention is defined by the claims.

We claim:

1. A process for selecting a piston ring for a piston containing internal combustion engine, the process comprising:
   providing an internal combustion engine that contains a piston;
   providing engine specifications for the internal combustion engine;
   simulating engine temperatures for the internal combustion engine as a function of the engine specifications;
   simulating bore distortion for the internal combustion engine as a function of the simulated engine temperatures;
   simulating piston ring dynamics for the internal combustion engine as a function of the simulated bore distortion including simulating fluttering of a top piston ring as a function of at least one of a ring gap for a second piston ring and an upper land chamfer radius of a second piston groove for the second piston ring, and also including calculating a reverse flutter index (RFI) for the top piston ring using the expression:

$$RFI = \frac{\sum_{CA=90}^{CA=270} \frac{mdot13}{P3}}{\sum_{CA=90}^{CA=270} \theta_{CA}}$$

where mdot13 is a mass flow rate through a ring gap for the top piston ring, P3 is a pressure between a liner and a piston land between the top piston ring and the second piston ring and $\theta_{CA}$ is a crank angle for the piston;

calculating a plurality of lubrication oil consumption values as a function of the simulated ring dynamics; and selecting a piston ring as a function of the calculated lubrication oil consumption values, the selected piston ring improving fuel economy for the internal combustion engine.

2. The process of claim 1, wherein providing engine specifications includes providing at least one of an engine load, revolutions per minute for an engine load, a coolant flow rate for an engine load, piston properties for the engine, cylinder liner properties for the engine and engine head properties for the engine.

3. The process of claim 1, wherein simulating engine temperatures provides at least one of an engine block temperature, an engine head temperature, a cylinder liner temperature and a valve seat temperature for the engine.

4. The process of claim 1, further providing simulating engine distortion.

5. The process of claim 4, wherein the simulated engine distortion is a function of at least one of engine bolt load, engine gasket properties, engine assembly load and engine assembly plus thermal load.

6. The process of claim 1, wherein the simulated ring dynamics is a function of at least one of engine piston specifications, piston ring specifications, engine cylinder pressure and engine crankcase pressure.

7. The process of claim 1, further including plotting RFI for one or more second piston ring gaps as a function of the upper land chamfer radius of the second piston ring groove, for the purpose of determining one or more piston ring gaps that provide a reduced RFI.

8. The process of claim 1, further including correlating RFI with actual lubrication oil consumption for the engine, for the purpose of confirming which one or more piston ring gaps provide a reduced lubrication oil consumption.

9. The process of claim 1, further including simulating a ring-liner conformability.

* * * * *